United States Patent
Sugisawa et al.

[11] Patent Number: 6,125,153
[45] Date of Patent: Sep. 26, 2000

[54] DATA PROCESSOR AND DATA PROCESSING METHOD

[75] Inventors: Yuji Sugisawa; Minoru Okamoto, both of Osaka, Japan

[73] Assignee: Matsushita Electric Industrial Co., Ltd., Osaka, Japan

[21] Appl. No.: 08/997,378

[22] Filed: Dec. 23, 1997

[30] Foreign Application Priority Data

Dec. 24, 1996 [JP] Japan .................................. 8-342963

[51] Int. Cl.⁷ ...................................................... H03D 1/00
[52] U.S. Cl. ........................................... 375/341; 714/795
[58] Field of Search ..................................... 375/341, 262, 375/340; 714/794, 795, 796; 371/43.7

[56] References Cited

U.S. PATENT DOCUMENTS

| | | |
|---|---|---|
| 5,295,142 | 3/1994 | Hatakeyama . |
| 5,327,440 | 7/1994 | Frederickson et al. . |
| 5,432,803 | 7/1995 | Liu et al. ................ 714/794 |
| 5,479,419 | 12/1995 | Naoi et al. .............. 714/794 |
| 5,787,127 | 7/1998 | Ono et al. ............... 375/341 |
| 5,887,007 | 3/1999 | Iwata et al. ............. 371/43.7 |
| 5,917,862 | 6/1999 | Shimoda ................. 375/341 |
| 5,928,378 | 7/1999 | Choi ....................... 714/795 |
| 5,935,270 | 8/1999 | Lin ......................... 714/795 |
| 5,964,897 | 10/1999 | Michel et al. .......... 714/795 |
| 5,982,822 | 11/1999 | Hatakeyama ........... 375/341 |

FOREIGN PATENT DOCUMENTS

| | | |
|---|---|---|
| 0398690 | 5/1990 | European Pat. Off. . |
| 07245567 | 9/1995 | Japan . |
| 08340262 | 12/1996 | Japan . |

*Primary Examiner*—Stephen Chin
*Assistant Examiner*—Lenny Jiang
*Attorney, Agent, or Firm*—McDermott, Will & Emery

[57] ABSTRACT

In a data processor for updating path metrics in Viterbi decoding, an ACS processing can be efficiently executed with small power consumption. An ACS processing unit obtains an updated path metric through an ACS processing on the basis of pre-update path metrics read from a memory. In the memory, two pre-update path metrics necessary for obtaining one updated path metric are stored in an even address and an odd address having common bits excluding the least significant bits, so that the two pre-update path metrics can be read through one access. In the first cycle, the ACS processing unit makes an access to the memory and obtains a first updated path metric through the ACS processing on the basis of the thus read two pre-update path metrics. In the second cycle, without making any access to the memory, the ACS processing unit obtains a second updated path metric through the ACS processing on the basis of the two pre-update path metrics read in the first cycle.

19 Claims, 10 Drawing Sheets

Fig. 3(a)

| | | |
|---|---|---|
| 0000h | PM(000) | PM(001) | 0001h |
| 0002h | PM(010) | PM(011) | 0003h |
| 0004h | PM(100) | PM(101) | 0005h |
| 0006h | PM(110) | PM(111) | 0007h |

MEMORY 10

Fig. 3(b)

| | | |
|---|---|---|
| 41 | BM(000, 000) | BM(000, 100) | 42 |
| 43 | BM(010, 001) | BM(010, 101) | 44 |
| 45 | BM(100, 010) | BM(100, 110) | 46 |
| 47 | BM(110, 011) | BM(110, 111) | 48 |

REGISTER

Fig. 4

| | | |
|---|---|---|
| 0c00h | PM'(000) | | 0c01h |
| 0c02h | | | 0c03h |
| 0c04h | PM'(100) | | 0c05h |
| 0c06h | | | 0c07h |

MEMORY 20

Fig. 8(a)

| | | |
|---|---|---|
| 0000h | PM(000) | PM(001) | 0001h |
| 0002h | PM(100) | PM(101) | 0003h |
| 0004h | PM(010) | PM(011) | 0005h |
| 0006h | PM(110) | PM(111) | 0007h |

MEMORY 10

Fig. 8(b)

| | | |
|---|---|---|
| 41 | BM(000, 000) | BM(000, 100) | 42 |
| 43 | BM(100, 010) | BM(100, 110) | 44 |
| 45 | BM(010, 001) | BM(010, 101) | 46 |
| 47 | BM(110, 011) | BM(110, 111) | 48 |

REGISTER

Fig. 9

| | | |
|---|---|---|
| 0c00h | PM'(000) | | 0c01h |
| 0c02h | PM'(100) | | 0c03h |
| 0c04h | | | 0c05h |
| 0c06h | | | 0c07h |

MEMORY 20

DATA PROCESSOR AND DATA PROCESSING METHOD

BACKGROUND OF THE INVENTION

The present invention relates to a data processor and a data processing method for a path metric updating process, that is, a principle process in Viterbi decoding.

Recently, a variety of systems for rapidly transferring data such as image data and speech data have been introduced into digital data communications. In such data transfer, an algorithm called Viterbi decoding is generally adopted for decreasing bit errors in the data. On the other hand, in accordance with improvement in the performance of a digital signal processor (hereinafter referred to as the DSP), Viterbi decoding algorithm is generally executed by a DSP.

Update of path metrics is one of the main processes in Viterbi decoding. In this update process, path metrics corresponding to respective states of a convolutional encoder are updated in order to decode signals encoded by the convolutional encoder at a receiver side. Specifically, the update process includes a series of steps as follows: Pre-update path metrics and corresponding branch metrics are added to each other with regard to two states, and the results of these two additions are compared with each other, so that the smaller result is selected as an updated path metric. Such a series of calculations are designated as an ACS (add compare select) processing because addition, calculation and selection are continuously executed. In general, such an update process of the path metrics is executed several tens through several hundreds times.

In the conventional update process of the path metrics, for obtaining one updated path metric, one pre-update path metric is first read from a memory, the read path metric is added to a corresponding branch metric and the result of the addition is stored in a register. Next, another pre-update path metric is read from the memory, the read path metric is added to a corresponding branch metric and the result of the addition is stored in the register. Then, the two data stored in the register are compared with each other so as to select an updated path metric.

However, in the conventional update process of the path metrics, a large number of steps are required for obtaining one updated path metric. This prevents Viterbi decoding from being executed at a higher speed.

Furthermore, in order to obtain one updated path metric, the memory for storing the pre-update path metrics is required to be accessed as frequently as twice. This not only prevents Viterbi decoding from being executed at a higher speed but also prevents power consumption of the processor from decreasing. In a DSP, power consumed through access to a memory occupies a very large proportion in the total power consumption of the DSP, and hence, decrease of the frequency of the memory access can largely decrease the total power consumption of the DSP.

SUMMARY OF THE INVENTION

According to the invention, an ACS processing can be efficiently executed with small consumption in a data processor and a data processing method for updating path metrics in Viterbi decoding.

FIG. 1 shows an example of a trellis diagram used in Viterbi decoding, wherein a constraint length k of convolutional code is 4. Since the number of states is $2^{(k-1)}$ in Viterbi decoding with a constraint length k, there are 8 ($=2^{(4-1)}$) states ranging from a state 000 to a state 111 as is shown in FIG. 1 when the constraint length k is 4.

As is shown in FIG. 1, the updated state 000 can be obtained from the pre-update states 000 and 111. Specifically, in order to obtain an updated path metric in the state 000, two pre-update path metrics in the states 000 and 111 are necessary. Furthermore, the updated state 100 can be also obtained from the pre-update states 000 and 001, and hence, it is also the pre-update path metrics in the states 000 and 001 that are necessary for obtaining an updated path metric in the state 100. Such a relationship can generally always hold owing to the principle of convolutional code and Viterbi decoding. Similarly, although not shown in FIG. 1, the updated state 001 or 101 can be obtained from the pre-update states 010 and 011, the updated state 010 or 110 can be obtained from the pre-update states 100 and 101, and the updated state 011 or 111 can be obtained from the pre-update states 110 and 111.

In view of the aforementioned relationship, the present invention makes two pre-update path metrics necessary for obtaining one updated path metric readable together, thereby attaining small power consumption and a high operation speed of a processor.

Also in view of the aforementioned relationship, the two pre-update path metrics read for obtaining one updated path metric are used to obtain another updated path metric in this invention, thereby attaining small power consumption and a high operation speed of a processor.

Specifically, the data processor of this invention for updating path metrics in Viterbi decoding comprises path metric storing means for storing pre-update path metrics in a manner that two pre-update path metrics necessary for obtaining one updated path metric are readable through one access; and an ACS processing unit for obtaining an updated path metric through an ACS processing on the basis of two pre-update path metrics read from the path metric storing means through one access.

In this data processor, in obtaining one updated path metric, in order to read the two pre-update path metrics necessary for obtaining the one updated path metric, the path metric storing means is accessed not twice but once. Therefore, power consumption due to the access to the path metric storing means can be suppressed, resulting in decreasing the total power consumption of the data processor. In addition, since the frequency of the access to the path metric storing means can be halved, the data processor can attain a high operation speed.

In the data processor, the path metric storing means preferably includes a memory that stores the pre-update path metrics.

Furthermore, the memory preferably has a configuration that allows data respectively stored in an even address and an odd address having common bits excluding the least significant bits to be read through one access, and the path metric storing means preferably stores, in the memory, two pre-update path metrics necessary for obtaining one updated path metric respectively in an even address and an odd address having common bits excluding the least significant bits.

In this manner, two pre-update path metrics necessary for obtaining one updated path metric can be definitely read from the memory included in the path metric storing means through one access.

Alternatively, the data processor of this invention for updating path metrics in Viterbi decoding comprises path metric storing means for storing pre-update path metrics; and an ACS processing unit for obtaining a first updated path metric through an ACS processing on the basis of two pre-update path metrics read from the path metric storing means and for obtaining a second updated path metric through the ACS processing on the basis of the same two pre-update path metrics.

In this data processor, by utilizing the characteristic of Viterbi decoding that two pre-update path metrics necessary for obtaining one updated path metric can be used for obtaining another updated path metric, the second updated path metric is obtained on the basis of the two pre-update path metric read for obtaining the first updated path metric. As a result, there is no need to make an access to the path metric storing means in obtaining the second updated path metric. Therefore, not only the total power consumption of the data processor can be decreased by suppressing the power consumption due to the access to the path metric storing means but also the data processor can attain a high operation speed because the frequency of the access to the path metric storing means can be halved.

Furthermore, the data processing method of this invention for updating path metrics in Viterbi decoding comprises a path metric reading step of reading, through one access, two pre-update path metrics necessary for obtaining one updated path metric from path metric storing means for storing pre-update path metrics; and an ACS processing step of executing an ACS processing for obtaining an updated path metric on the basis of two pre-update path metrics read in the path metric reading step.

In this data processing method, in obtaining one updated path metric, two pre-update path metrics necessary for obtaining the one updated path metric are read from the path metric storing means through one access. Therefore, not only the power consumption due to the access to the path metric storing means can be suppressed but also the path metric updating process can be executed at a high speed because the frequency of the access to the path metric storing means can be halved.

Alternatively, the data processing method of this invention for updating path metrics in Viterbi decoding comprises a path metric reading step of reading two pre-update path metrics necessary for obtaining one updated path metric from path metric storing means for storing pre-update path metrics; a first ACS processing step of obtaining a first updated path metric through an ACS processing on the basis of two pre-update path metrics read in the path metric reading step; and a second ACS processing step of obtaining a second updated path metric through the ACS processing on the basis of the same two pre-update path metrics read in the path metric reading step.

In this data processing method, by utilizing the characteristic of Viterbi decoding that two pre-update path metrics necessary for obtaining one updated path metric can be used for obtaining another updated path metric, the first updated path metric is obtained through the first ACS processing and the second updated path metric is obtained through the second ACS processing both on the basis of the two pre-update path metrics read in the path metric reading step. Therefore, the frequency of the access to the path metric storing means can be halved, so that the power consumption due to the access to the path metric storing means can be suppressed and that the path metric updating process can be executed at a high speed.

BRIEF DESCRIPTION OF THE DRAWINGS

FIG. 3(a) is a diagram for showing stored states of pre-update path metrics in a memory 10 of the data processor of the first embodiment, and FIG. 3(b) is a diagram for showing stored states of branch metrics in registers 41 through 48 of the data processor of the first embodiment;

FIG. 4 is a diagram for showing stored states of updated path metrics in a memory 20 of the data processor of the first embodiment;

FIG. 8(a) is a diagram for showing stored states of preupdate path metrics in a memory 10 of the data processor of the second embodiment, and FIG. 8(b) is a diagram for showing stored states of branch metrics in registers 41 through 48 of the data processor of the second embodiment;

FIG. 9 is a diagram for showing stored states of updated path metrics in a memory 20 of the data processor of the second embodiment.

DETAILED DESCRIPTION OF THE INVENTION

In the following description, a pre-update path metric in a state X is indicated as PM(X), an updated path metric in the state X is indicated as PM'(X), and a branch metric between a pre-update state Y and an updated state Z is indicated as BM(Y,Z).

(Embodiment 1)

Figure 2:
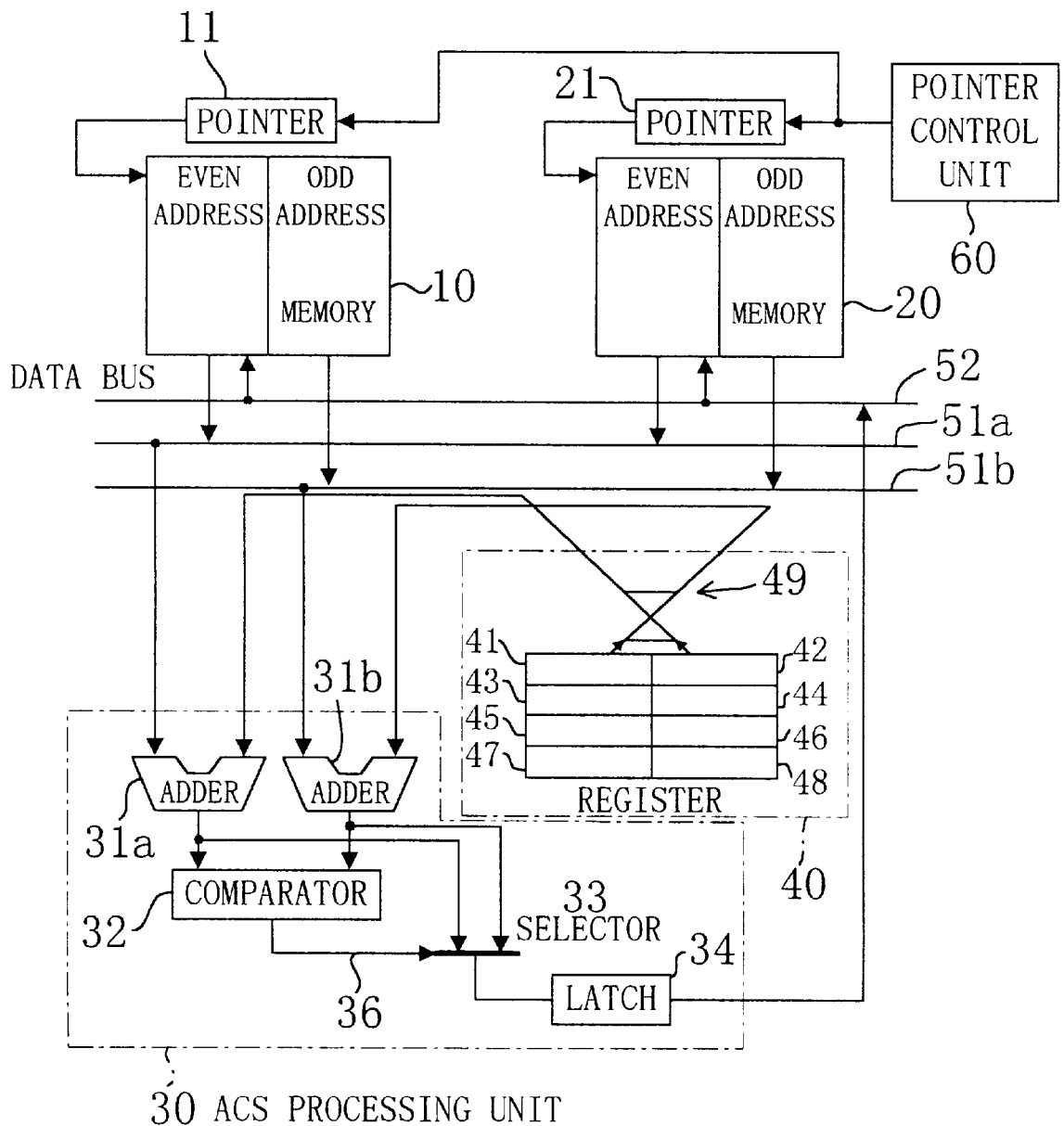
FIG. 2 is a diagram for showing the configuration of the data processor according to the first and second embodiments of the invention.

FIG. 2 is a block diagram for showing the configuration of a data processor according to a first embodiment of the invention. In FIG. 2, a reference numeral 10 denotes a memory for storing pre-update path metrics, a reference numeral 11 denotes a pointer for specifying an address in the memory 10, a reference numeral 20 denotes a memory for storing updated path metrics, a reference numeral 21 denotes a pointer for specifying an address in the memory 20, a reference numeral 30 denotes an ACS processing unit for executing an ACS processing, reference numerals 41 through 48 denote registers for storing branch metrics, a reference numeral 49 denotes a swapper, reference numerals 51a and 51b denote data buses for transferring the pre-update path metrics read from the memory 10 to the ACS processing unit 30, a reference numeral 52 denotes a data bus for transferring the updated path metrics output by the ACS processing unit 30 to the memory 20, and a reference numeral 60 denotes a pointer control unit for controlling the pointers 11 and 21.

The ACS processing unit 30 includes a first adder 31a for adding a pre-update path metric read from the memory 10 and transferred through the data bus 51a to a branch metric read from any of the registers 41 through 48 through the swapper 49, a second adder 31b for adding a pre-update path metric read from the memory 10 and transferred through the data bus 51b to a branch metric read from any of the registers 41 through 48 through the swapper 49, a comparator 32 for comparing the results of the additions by the first and second adders 31a and 31b, a selector 33 working as selecting means for selectively outputting one of the results of the additions by the first and second adders 31a and 31b on the basis of the comparison by the comparator 32, and a latch 34 for holding the output data from the selector 33, namely, an updated path metric.

The memory 10, the pointer 11 and the pointer control unit 60 together form one path metric storing means, and the memory 20, the pointer 21 and the pointer control unit 60 together form another path metric storing means. Also, the registers 41 through 48 and the swapper 49 together form branch metric storing means 40.

Figure 1:
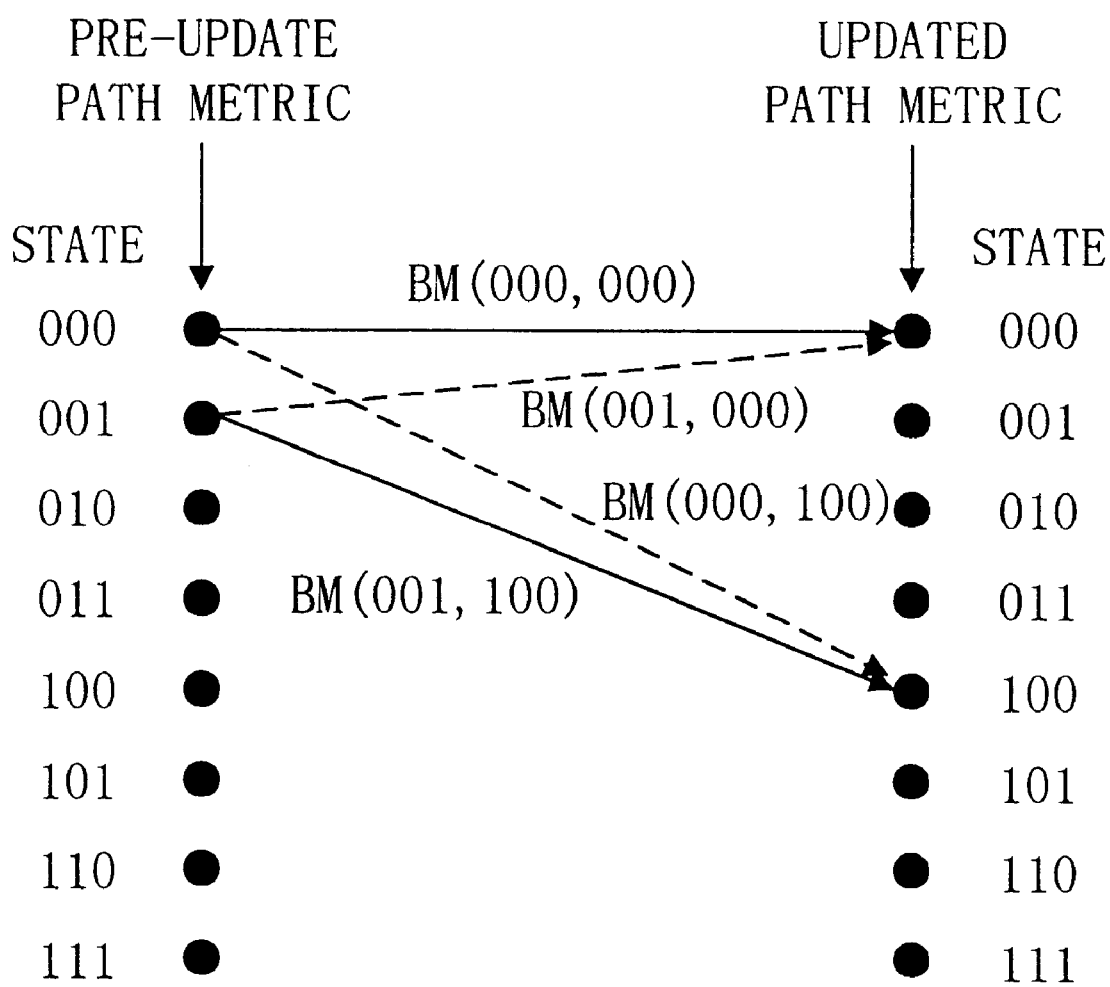
FIG. 1 is an example of a trellis diagram, showing a base of an operation of a data processor according to a first embodiment of the invention.

The data processor of FIG. 2 updates path metrics in accordance with the trellis diagram of FIG. 1 in Viterbi decoding where a constraint length k of convolutional code is 4 and an encoding ratio R is 1/3. Accordingly, the memory 10 stores pre-update path metrics respectively corresponding to 8 (namely, $2^{(k-1)}=2$) states. Also, the number of registers for storing the branch metrics is 8 (namely, $2^{(1/R)}=2^3$).

FIG. 3(a) is a diagram for showing stored states of the pre-update path metrics in the memory 10. As is shown in FIG. 3(a), the memory 10 stores the pre-update path metrics in the ascending order of bits indicating their states (namely, in the downward order in FIG. 1) from an address 0000h (wherein h indicates a hexadecimal digit; which also applies to the following description) as a leading address. Specifically, a path metric PM(000) is stored in the address 0000h, a path metric PM(001) is stored in an address 0001h, a path metric PM(010) is stored in an address 0002h, a path metric PM(011) is stored in an address 0003h, a path metric PM(100) is stored in an address 0004h, a path metric PM(101) is stored in an address 0005h, a path metric PM(110) is stored in an address 0006h, and a path metric PM(111) is stored in an address 0007h.

The memory 10 has a function that data respectively stored in an even address and an odd address having common high order bits excluding the least significant bit of an address specified by the pointer 11 are read through one access. A pre-update path metric read from the even address is output to the data bus 51a and a pre-update path metric read from the odd address is output to the data bus 51b. For example, when the pointer 11 outputs the address 0000h, a data at the address 0000h in the memory 10, namely, the path metric PM(000), is output to the data bus 51a, and a data at the address 0001h in the memory 10, namely, the path metric PM(001), is output to the data bus 51b.

On the other hand, the memory 20 stores updated path metrics in the ascending order of bits indicating their states from an address 0c00h as a leading address. The pointers 11 and 12 hold the leading address 0000h of the memory 10 and the leading address 0c00h of the memory 20 as the addresses to be specified, respectively.

FIG. 3(b) is a diagram for showing stored states of the branch metrics in the registers 41 through 48. As is shown in FIG. 3(b), the register 41 stores a branch metric BM(000, 000), the register 42 stores a branch metric BM(000,100), the register 43 stores a branch metric BM(010,001), the register 44 stores a branch metric BM(010,101), the register 45 stores a branch metric BM(100,010), the register 46 stores a branch metric BM(100,110), the register 47 stores a branch metric BM(110,011), and the register 48 stores a branch metric BM(110,111) previously.

In Viterbi decoding, the following formula generally holds among the branch metrics:

$$BM(abc,dab)=BM(ab\sim c,\sim dab) \quad (1)$$

wherein each of a, b, c and d is {0,1}, and a symbol ~ indicates inversion. For example, in the trellis diagram of FIG. 1, the following formulas hold:

$$BM(000,000)=BM(001,100) \quad (2)$$

$$BM(000,100)=BM(001,000) \quad (3)$$

The principle for allowing such relationships to hold will be described later. In this embodiment, by utilizing the relationship represented by the formula (1), the branch metrics stored in the registers 41 through 48 are specified.

Now, the operation of the data processor of FIG. 2 will be described. In the first cycle, an updated path metric PM' (000) in the state 000 will be obtained.

First, the pointer 11 specifies the address 0000h of the memory 10. The memory 10 outputs, respectively to the data buses 51a and 51b, two pre-update path metrics respectively stored in an even address and an odd address having common high order bits excluding the least significant bit of the address specified by the pointer 11. Specifically, the memory 10 outputs the path metric PM(000) stored in the address 0000h to the data bus 51a and the path metric PM(001) stored in the address 0001h to the data bus 51b. The path metrics PM(000) and PM(001) are, as is obvious from FIG. 1, two pre-update path metrics necessary for obtaining the path metric PM'(000).

Subsequently, in the ACS processing unit 30, the first adder 31a adds the pre-update path metric PM(000) transferred through the data bus 51a to the branch metric BM(000,000) read from the register 41 through the swapper 49, and the second adder 31b adds the pre-update path metric PM(001) transferred through the data bus 51b to the branch metric BM(000,100) (=BM(001,000)) read from the register 42 through the swapper 49.

The comparator 32 compares the result of the addition by the first adder 31a with the result of the addition by the second adder 31b. When the result obtained by the first adder 31a is smaller, the comparator 32 outputs "1" as a selection signal 36, and when not, the comparator 32 outputs "0" as the selection signal 36. When the selection signal 36 is "1", the selector 33 selectively outputs the result of the addition by the first adder 31a to the latch 34, and when the selection signal 36 is "0", the selector 33 selectively outputs the result of the addition by the second adder 31b to the latch 34. The latch 34 holds the output data of the selector 33, namely, the updated path metric PM'(000).

Next, in the second cycle, an updated path metric PM' (100) in the state 100 will be obtained.

The ACS processing unit 30 outputs the updated path metric held by the latch 34, and the output updated path metric is transferred through the data bus 52 to be written in the memory 20 at an address specified by the pointer 21. Specifically, the updated path metric PM'(000) is written in the address 0c00h of the memory 20.

Subsequently, the pre-update path metrics PM(000) and PM(001) output to the data buses 51a and 51b in the first cycle are used in executing the subsequent ACS processing. At this point, the swapper 49 substitutes the branch metrics so that the branch metric input to the first adder 31a in the first cycle can be input to the second adder 31b in this cycle and that the branch metric input to the second adder 31b in the first cycle can be input to the first adder 31a in this cycle.

Specifically, in the second cycle, without making any access to the memory 10, the first adder 31a adds the pre-update path metric PM(000) input through the data bus 51a to the branch metric BM(000,100) read from the register 42 through the swapper 49, and the second adder 31b adds the pre-update path metric PM(001) input through the data bus 51b to the branch metric BM(000,000) (=BM(001,100)) read from the register 41 through the swapper 49 in the ACS processing unit 30.

The comparator 32 and the selector 33 are operated in the same manner as in the first cycle, so that the latch 34 can hold the output data of the selector 33, namely, the update path metric PM'(100).

The pointer control unit 60 adds "2" to the address held by the pointer 11 and adds "4" to the address held by the pointer 21. Thus, the address held by the pointer 11 becomes the address 0002h, and the address held by the pointer 21 becomes an address 0c04h.

In the third cycle, an updated path metric PM'(001) in the state 001 will be obtained.

The ACS processing unit 30 outputs the data held by the latch 34, namely, the updated path metric, to the data bus 52, and the output updated path metric is written in the memory 20 at an address specified by the pointer 21. Specifically, the updated path metric PM'(100) is written at the address 0c04h in the memory 20. FIG. 4 shows stored states of the updated path metrics in the memory 20 at this point.

Subsequently, since the pointer 11 specifies the address 0002h, pre-update path metrics PM(010) and PM(011) are respectively read from the addresses 0002h and 0003h in the memory 10, and the branch metrics BM(010,001) and BM(010,101) (=BM(011,001)) are respectively read from the registers 43 and 44. Thereafter, through the same procedures as conducted in the first cycle, the updated path metric PM'(001) is held by the latch 34.

The pointer control unit 60 subtracts "3" from the address held by the pointer 21. Thus, the address held by the pointer 21 becomes an address 0c01h.

In the fourth cycle, an updated path metric PM'(101) in the state 101 will be obtained.

The ACS processing unit 30 outputs the data held by the latch 34, namely, the updated path metric, to the data bus 52, and the output updated path metric is written in the memory 20 at an address specified by the pointer 21. Specifically, the updated path metric PM'(001) is written in the memory 20 at the address 0c01h.

Subsequently, the pre-update path metrics PM(010) and PM(011) respectively output to the data buses 51a and 51b in the third cycle are used in executing the subsequent ACS processing. Specifically, in the fourth cycle, without making any access to the memory 10, the first adder 31a adds the pre-update path metric PM(010) input through the data bus 51a to the branch metric BM(010,101) read from the register 44 through the swapper 49, and the second adder 31b adds the pre-update path metric PM(011) input through the data bus 51b to the branch metric BM(010,001) (=BM(011,101)) read from the register 43 through the swapper 49 in the ACS processing unit 30. Thereafter, through the same procedures as conducted in the second cycle, the updated path metric PM'(101) is held by the latch 34.

The pointer control unit 60 adds "4" to the address held by the pointer 21, and adds "2" to the address held by the pointer 11. Thus, the address held by the pointer 11 becomes the address 0004h and the address held by the pointer 21 becomes an address 0c05h.

Figure 5:
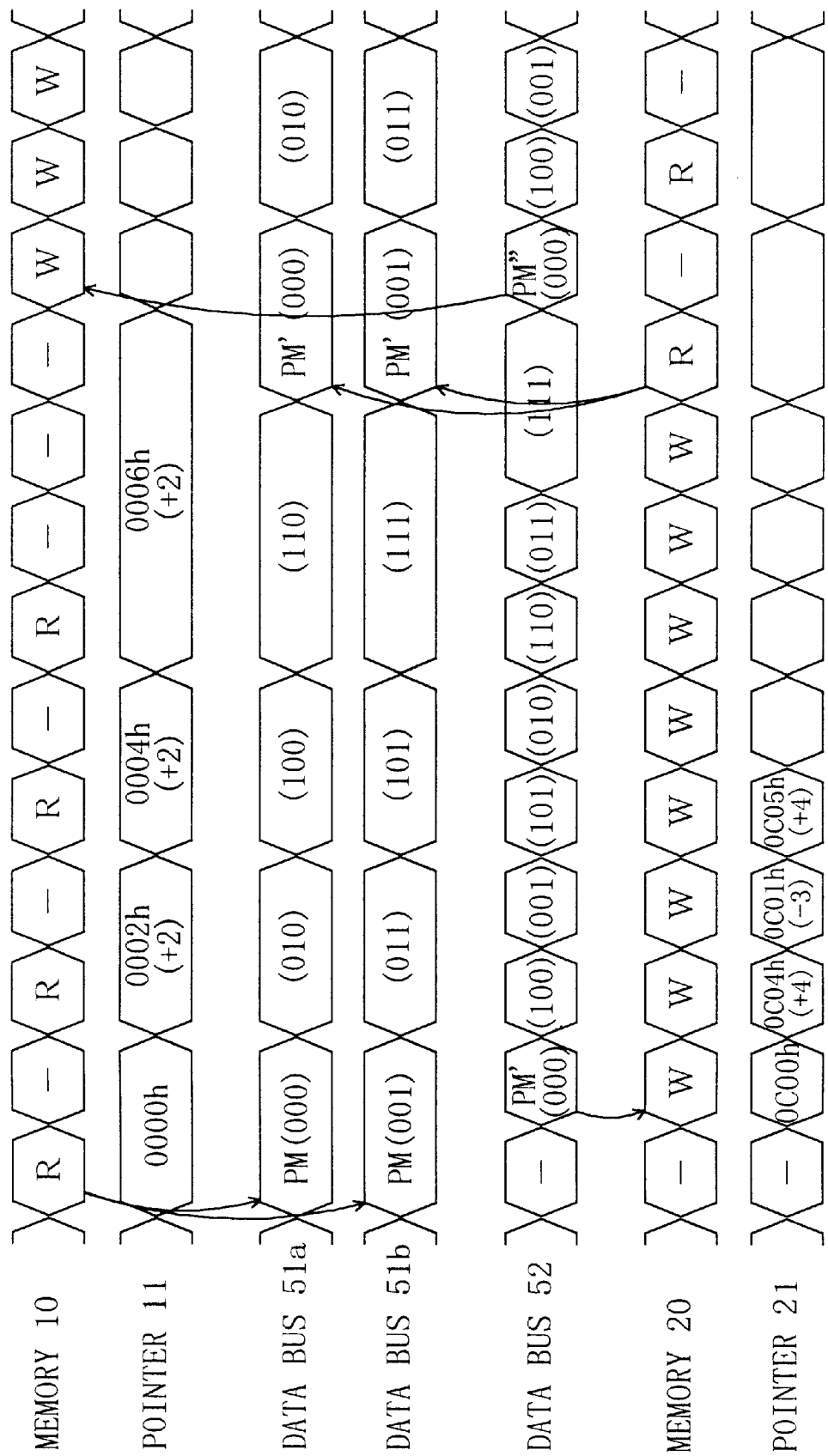
FIG. 5 is a timing chart for showing an operation of the data processor of FIG. 2.

Thereafter, by repeating similar procedures, the path metrics are updated. FIG. 5 is a timing chart for showing the operation of the data processor of this embodiment shown in FIG. 2. As is shown in FIG. 5, after all updated path metrics PM'(X) obtained by the ACS processing unit 30 on the basis of pre-update path metrics PM(X) stored in the memory 10 are stored in the memory 20, the read(R)/write(W) operations are switched between the memory 10 and the memory 20. Then, the ACS processing unit 30 executes the ACS processing by using the updated path metrics PM'(X) stored in the memory 20 as new pre-update path metrics, so as to obtain new updated path metrics PM"(X).

Similarly to the memory 10, the memory 20 has a function that data respectively stored in an even address and an odd address having common high order bits excluding the least significant bit of the address specified by the pointer 21 are read through one access, so that an updated path metric read from the even address can be output to the data bus 51a and that an updated path metric read from the odd address can be output to the data bus 51b.

The memory 20 stores the updated path metrics in the same manner as the pre-update path metrics stored in the memory 10 as is shown in FIG. 3(a). Therefore, through the same procedures as those for obtaining the updated path metrics on the basis of the pre-update path metrics stored in the memory 10, the new updated path metrics can be obtained on the basis of the updated path metrics stored in the memory 20. The thus obtained new updated path metrics are stored in the memory 10 through the data bus 52. Thereafter, the path metrics can be repeatedly updated by using the memories 10 and 20. Accordingly, the path metrics can be continuously updated by using a small memory capacity. It goes without saying that the new updated path metrics can be stored in another memory.

In this manner, when an updated path metric (for example, the path metric PM'(000)) is to be obtained, two pre-update path metrics (PM(000) and PM(001)) necessary for the ACS processing can be read through one access to the memory 10 storing the pre-update path metrics in this embodiment. Furthermore, since the thus read two pre-update path metrics are used for obtaining another updated path metric (PM'(100)), the frequency of the access to the memory 10 can be further decreased.

Now, the principle for allowing the relationship as represented by the formula (1) to hold among the branch metrics will be described.

Figure 6:
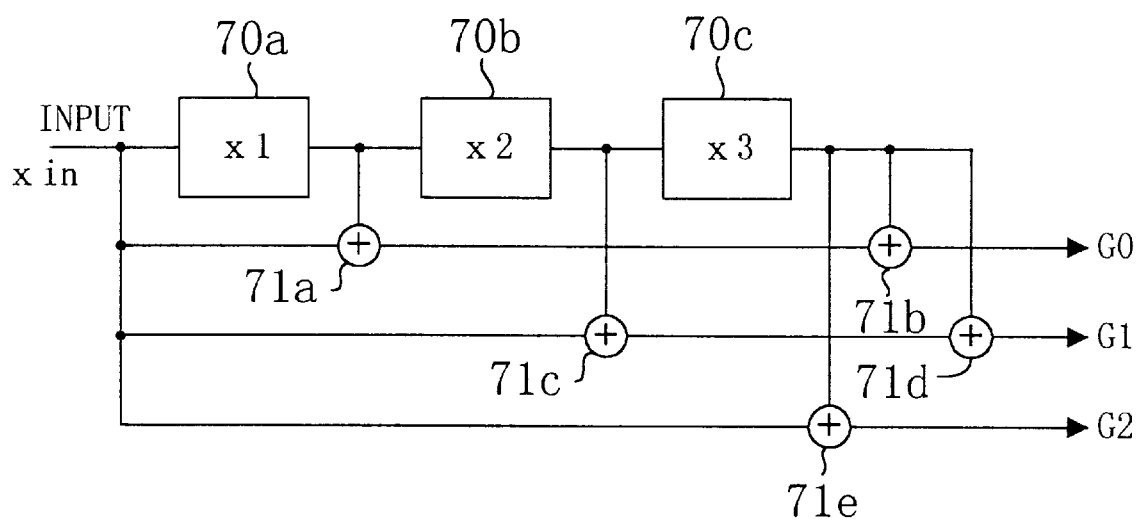
FIG. 6 is a diagram for showing an exemplified configuration of a convolutional encoder.

FIG. 6 is a diagram for showing an exemplified configuration of a convolutional encoder having a constraint length k of convolutional code of 3 and an encoding ratio R of 1/3. The convolutional encoder of FIG. 6 generates signals G0, G1 and G2 of 3 bits from an input data signal xin of 1 bit, and reference numerals 70a through 70c denote shift registers and reference numeral 71a through 71e denote exclusive OR circuits. Also, x1, x2 and x3 indicate signals held by the shift registers 70a through 70c, respectively.

When a signal encoded by the convolutional encoder of FIG. 6 is to be decoded by using Viterbi decoding algorithm at a receiver side, the trellis diagram as is shown in FIG. 1 is obtained. At this point, when signals of 3 bits actually received through radio communication or the like and including an error are indicated as y1, y2 and y3, a branch metric can be defined as follows:

$$\text{Branch metric} = |y1-G0| + |y2-G1| + |y3-G2| \qquad (4)$$

G0=xin xor x1 xor x3

G1=xin xor x2 xor x3

G2=xin xor x3

The respective states shown in the trellis diagram of FIG. 1 represent data respectively held by the shift registers of the convolutional encoder at an arbitrary time T, and in obtaining a branch metric in FIG. 1, the received signals y1, y2 and y3 are considered to be constant. Accordingly, as is obvious from the formula (4), a branch metric is determined by the encoded signals G0, G1 and G2, and when the signals G0, G1 and G2 are equal, branch metrics are naturally equal.

The signals G0, G1 and G2 are determined depending upon connection data in the convolutional encoder. Therefore, it is determined on the basis of the connection data in the convolutional encoder whether or not the relationship represented by the formula (1) holds.

In general, in the case where an input signal line and an output signal line of the last shift register are connected with an exclusive OR circuit, the relationship represented by the formula (1) holds.

For example, in the convolutional encoder of FIG. 6, the input signal xin and the output signal x3 of the shift register 70c are input to the exclusive OR circuit 71e. Therefore, in a branch metric (x1 x2 x3, xin x1 x2), G0=xinxor x1 xor x3
G1=xinxor x2 xor x3
G2=xinxor x3 and in a branch metric BM(x1 x2~x3, ~xinx1 x2),

G0=~xinxor x1 xor~x3
G1=~xinxor x2 xor~x3
G2=~xinxor~x3

The following relationship always holds owing to the characteristic of exclusive OR:

$$x\text{inxor } x3 = \sim x\text{inxor} \sim x3$$

Therefore, in the branch metrics BM(x1 x2 x3, xinx1 x2) and BM(x1 x2~x3, ~xinx1 x2), the signals G0, G1 and G2 are equal to one another. Accordingly, owing to the aforementioned relationship between the branch metrics and the encoded signals, the following relationship holds:

$$BM(x1\ x2\ x3, xinx1\ x2) = BM(x1\ x2\sim x3, \sim xinx1\ x2) \quad (5)$$

When the following are substituted in the formula (5), the formula (1) is obtained.

x1=a
x2=b
x3=c
xin=d (A) Regarding BM(000,000)=BM(001,100) . . . (2):
  BM(000,000): xin=0, x1=0, x2=0, x3=0
    G0=0xor 0xor 0=0
    G1=0xor 0xor 0=0
    G2=0xor 0=0
  BM(001,100): xin=1, x1=0, x2=0, x3=1
    G0=1xor 0xor 1=0
    G1=1xor 0xor 1=0
    G2=1xor 1=0
(B) Regarding BM(000,100)=BM(001,000) . . . (3):
  BM(000,100): xin=1, x1=0, x2=0, x3=3
    G0=1xor 0xor 0=1
    G1=1xor 0xor 0=1
    G2=1xor 0=1
  BM(001,000): xin=0, x1=0, x2=0, x3=1
    G0=0xor 0xor 1=1
    G1=0xor 0xor 1=1
    G2=0xor 1=1
(C) Regarding BM(110,111)=BM(111,011):
  BM(110,111): xin=1, x1=1, x2=1, x3=0
    G0=1xor 1xor 0=0
    G1=1xor 1xor 0=0
    G2=1xor 0=1
  BM(111,011): xin=0, x1=1, x2=1, x3=1
    G0=0xor 1xor 1=0
    G1=10or 1xor 1=0
    G2=0xor 1=1

In a convolutional encoder currently standardized in a portable telephone and the like, an input signal line and an output signal line of the last shift register are connected with an exclusive OR circuit. Therefore, the relationship represented by the formula (1) holds when a signal encoded by such a convolutional encoder is decoded by using Viterbi decoding.

(Embodiment 2)

In the data processor of FIG. 2, the stored states of the pre-update path metrics in the memory 10, the stored states of the branch metrics in the registers 41 through 48 and the stored states of the updated path metrics in the memory 20 are not limited to those shown in FIGS. 3(a), 3(b) and 4. The stored states of these metrics are varied depending upon a trellis chart used in Viterbi decoding.

Figure 7:
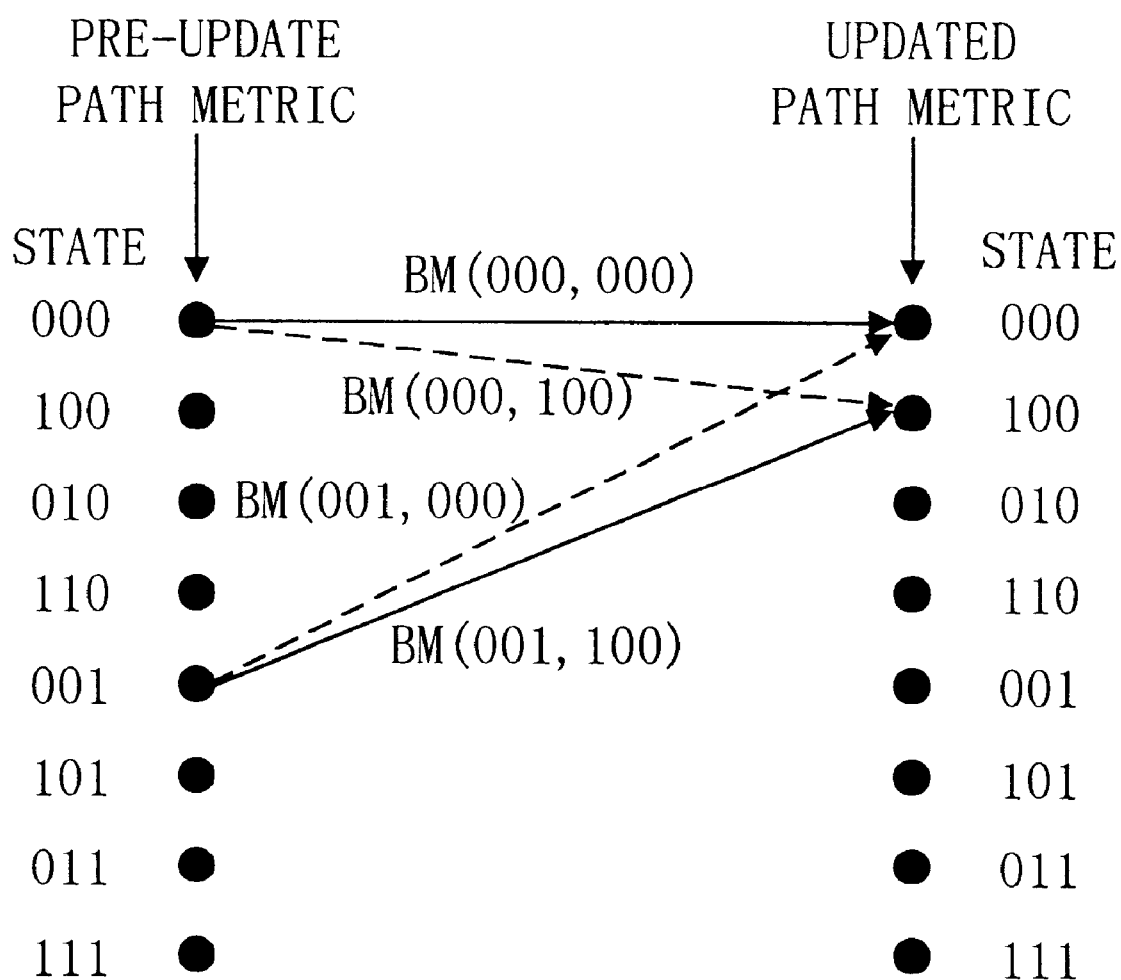
FIG. 7 is another example of the trellis diagram, showing a base of an operation of the data processor of the second embodiment of the invention.

FIG. 7 shows another example of the trellis diagram used in Viterbi decoding, which is substantially equal to the trellis diagram shown in FIG. 1. However, the order of arranging the states is different from that of FIG. 1, and in FIG. 7, the states are arranged in a manner that the bits are incremented from a higher order to a lower order. However, the corresponding relationship between the pre-update path metrics and the updated path metrics is the same as that shown in FIG. 1. For example, an updated path metric in the state 000 can be obtained from pre-update path metrics in the states 000 and 001, and an updated path metric in the state 100 can be obtained from pre-update path metrics in the states 000 and 001.

A data processor of this embodiment updates path metrics in accordance with the trellis diagram of FIG. 7. This data processor has the same configuration as that of the first embodiment shown in FIG. 2, but the stored states of the pre-update path metrics in the memory 10, the stored states of the branch metrics in the registers 41 through 48 and the stored states of the updated path metrics in the memory 20 are different from those of the first embodiment. Furthermore, since the stored states in the memories 10 and 20 are different, the pointers 11 and 21 are controlled by the pointer control unit 60 in a different manner from the first embodiment.

FIG. 8(a) is a diagram for showing the stored states of the pre-update path metrics in the memory 10 of this embodiment. As is shown in FIG. 8(a), the memory 10 stores the pre-update path metrics in the same order as in the trellis diagram of FIG. 7 from the address 0000h as a leading address, in even addresses first and in odd addresses thereafter. Specifically, a path metric PM(000) is stored in the address 0000h, a path metric PM(100) is stored in the address 0002h, a path metric PM(010) is stored in the address 0004h, a path metric PM(110) is stored in the address 0006h, a path metric PM(001) is stored in the address 0001h, a path metric PM(101) is stored in the address 0003h, a path metric PM(011) is stored in the address 0005h, and a path metric PM(111) is stored in the address 0007h.

On the other hand, the memory 20 stores the updated path metrics in the same order as the pre-update path metrics in the memory 10 from the address 0c00h as a leading address. The pointer 11 holds the leading address 0000h of the memory 10, and the pointer 21 holds the leading address 0c00h of the memory 20.

Furthermore, the registers 41 through 48 store the branch metrics correspondingly to the pre-update path metrics stored in the memory 10 as is shown in FIG. 8(b). Specifically, the register 41 stores a branch metric BM(000, 000), the register 42 stores a branch metric BM(000,100), the register 43 stores a branch metric BM(100,010), the register 44 stores a branch metric BM(100,110), the register 45 stores a branch metric BM(010,001), the register 46 stores a branch metric BM(010,101), the register 47 stores a branch metric BM(110,011), and the register 48 stores a branch metric BM(110,111) previously.

Now, the operation of the data processor of this embodiment will be described.

In the first cycle, the same procedures as in the first embodiment are conducted. First, the pointer 11 specifies the address 0000h of the memory 10. The memory 10 outputs, to the data buses 51a and 51b, two pre-update path metrics respectively stored in an even address and an odd address having common high order bits excluding the least significant bit of an address specified by the pointer 11. Specifically, the memory 10 outputs the path metric PM(000) stored at the address 0000h to the data bus 51a and the path metric PM(001) stored at the address 0001h to the data bus 51b. The path metrics PM(000) and PM(001) are, as is obvious from the trellis diagram of FIG. 7, two pre-update path metrics necessary for obtaining an updated path metric PM'(000).

Subsequently, in the ACS processing unit 30, the first adder 31a adds the pre-update path metric PM(000) transferred through the data bus 51a to the branch metric BM(000,000) read from the register 41 through the swapper 49, and the second adder 31b adds the pre-update path metric PM(001) transferred through the data bus 51b to the branch metric BM(000,100) (=BM(001,000)) read from the register 42 through the swapper 49. The comparator 32 compares the results of the additions by the first and second adders 31a and 31b. When the result obtained by the first adder 31a is smaller, the comparator 32 outputs "1" as the selection signal 36, and when not, the comparator 32 outputs "0". When the selection signal 36 is "1", the selector 33 selectively outputs the result of the addition by the first adder 31a to the latch 34, and when the selection signal 36 is "0", the selector 33 selectively outputs the result of the addition by the second adder 31b to the latch 34. The latch 34 holds the output data of the selector 33, namely, the updated path metric PM'(000).

In the second cycle, the ACS processing unit 30 outputs the updated path metric held by the latch 34, and the output updated path metric is transferred through the data bus 52 to be written in the memory 20 at an address specified by the pointer 21. Specifically, the updated path metric PM'(000) is written at the address 0c00h in the memory 20.

Subsequently, the pre-update path metrics PM(000) and PM(001) output to the data buses 51a and 51b in the first cycle are used in executing the subsequent ACS processing. At this point, the swapper 49 substitutes the branch metrics so that the branch metric input to the first adder 31a in the first cycle can be input to the second adder 31b in this cycle and that the branch metric input to the second adder 31b in the first cycle can be input to the first adder 31a in this cycle.

Specifically, in the second cycle, without making any access to the memory 10, the first adder 31a adds the pre-update path metric PM(000) input through the data bus 51a to the branch metric BM(000,100) read from the register 42 through the swapper 49 and the second adder 31b adds the pre-update path metric PM(001) input through the data bus 51b to the branch metric BM(000,000) (=BM(001,100)) read from the register 41 through the swapper 49 in the ACS processing unit 30.

The comparator 32 and the selector 33 are operated in the same manner as in the first cycle, so that the latch 34 can hold the output data of the selector 33, namely, an updated path metric PM'(100). The procedures so far are the same as those in the first embodiment.

Differently from the first embodiment, the pointer control unit 60 adds "2" to the address held by the pointer 11 and "2" to the address held by the pointer 21. Thus, the address held by the pointer 11 becomes the address 0002h and the address held by the pointer 21 becomes the address 0c02h.

In the third cycle, the data held by the latch 34 is output to the data bus 52, so as to be written in the memory 20 at an address specified by the pointer 21. Specifically, the updated path metric PM'(100) is written in the memory 20 at the address 0c02h. FIG. 9 is a diagram for showing the stored states of the updated path metrics in the memory 20 at this point.

Subsequently, since the address specified by the pointer 11 is the address 0002h, the pre-update path metrics PM(100) and PM(101) are respectively read from the addresses 0002h and 0003h of the memory 10, the branch metric BM(100, 010) is read from the register 43, and the branch metric BM(100,110) is read from the register 44. Thereafter, through the same procedures as those in the first cycle, an updated path metric PM'(010) is held by the latch 34.

The pointer control unit 60 adds "2" to the address hld by the pointer 21. Thus, the address held by the pointer 21 becomes the address 0c04h.

In the fourth cycle, the data held by the latch 34 is output to the data bus 52, so as to be written in the memory 20 at an address specified by the pointer 21. Specifically, the updated path metric PM'(010) is written in the memory 20 at the address 0c04h.

Subsequently, the pre-update path metrics PM(100) and PM(101) output to the data buses 51a and 51b in the third cycle are used in executing the subsequent ACS processing. Specifically, in the fourth cycle, without making any access to the memory 10, the first adder 31a adds the pre-update path metric PM(100) input through the data bus 51a to the branch metric BM(100,110) read from the register 44 through the swapper 49 and the second adder 31b adds the pre-update path metric PM(101) transferred through the data bus 51b to the branch metric BM(100,010) (=BM(101,110)) read from the register 43 through the swapper 49 in the ACS processing unit 30. Thereafter, through the same procedures as in the second cycle, an updated path metric PM'(110) is held by the latch 34.

The pointer control unit 60 adds "2" to the address held by the pointer 11 and "2" to the address held by the pointer 21. As a result, the address held by the pointer 11 becomes the address 0004h and the address held by the pointer 21 becomes the address 0c06h.

Thereafter, by repeating the same procedures, the path metrics are updated. In the subsequent fifth cycle, the pointer control unit 60 sets the address 0c01h as the address held by the pointer 21 in stead of adding "2" to the address held by the pointer 21, and in each cycle thereafter, the pointer control unit 60 adds "2" to the address held by the pointer 21.

In this manner, also in this embodiment, similarly to the first embodiment, when an updated path metric (for example, the path metric PM'(000)) is to be obtained, two pre-update path metrics (PM(000) and PM(001)) necessary for the ACS processing can be read through one access to the memory 10 storing the pre-update path metrics. Furthermore, since the thus read two pre-update path metrics are used to obtain another updated path metric (PM'(100)), the frequency of the access to the memory 10 can be further decreased.

It is noted that the stored states of the pre-update path metrics in the memory 10 are not limited to those described in the first and second embodiments, and any stored state is applicable as far as two pre-update path metrics used for obtaining one updated path metric are stored in even and odd addresses having the common high order bits. Furthermore, depending upon the configuration of the memory 10, it is not always necessary that the two pre-update path metrics are stored in even and odd addresses having the common high order bits, but any stored state is applicable as far as two pre-update path metrics used for obtaining one updated path metric can be read through one access. Moreover, means for storing the pre-update path metrics is not limited to a memory but can be, for example, a register.

In the first and second embodiments, the description is given on the data processor having a constraint length k of convolutional code of 4, but the data processor of this invention is applicable, in the same manner as in the first and second embodiments, to any convolutional code having an arbitrary constraint length (whereas of 3 or more). In such a case, the number of the states is $2^{(k-1)}$, and hence, the path metric storing means is required to be able to store $2^{(k-1)}$ pre-update path metrics. For example, when the constraint length k is 7, the path metric storing means is required to be able to store 64 path metrics, and when the constraint length k is 9, the path metric storing means is required to be able to store 256 path metrics.

Furthermore, the configuration of the ACS processing unit 30 is not limited to that shown in FIG. 2 but the ACS processing unit 30 can adopt any configuration as far as the two additions and the comparison can be executed in one cycle.

In addition, the branch metrics are not necessarily to be stored in the registers but can be stored in, for example, a memory.

Moreover, although two address generating portions (i.e., pointers) are required for the memory access, a DSP is generally provided with two independent address generating mechanisms for memory access. Therefore, the invention is applicable to any general DSP with ease.

Figure 10:
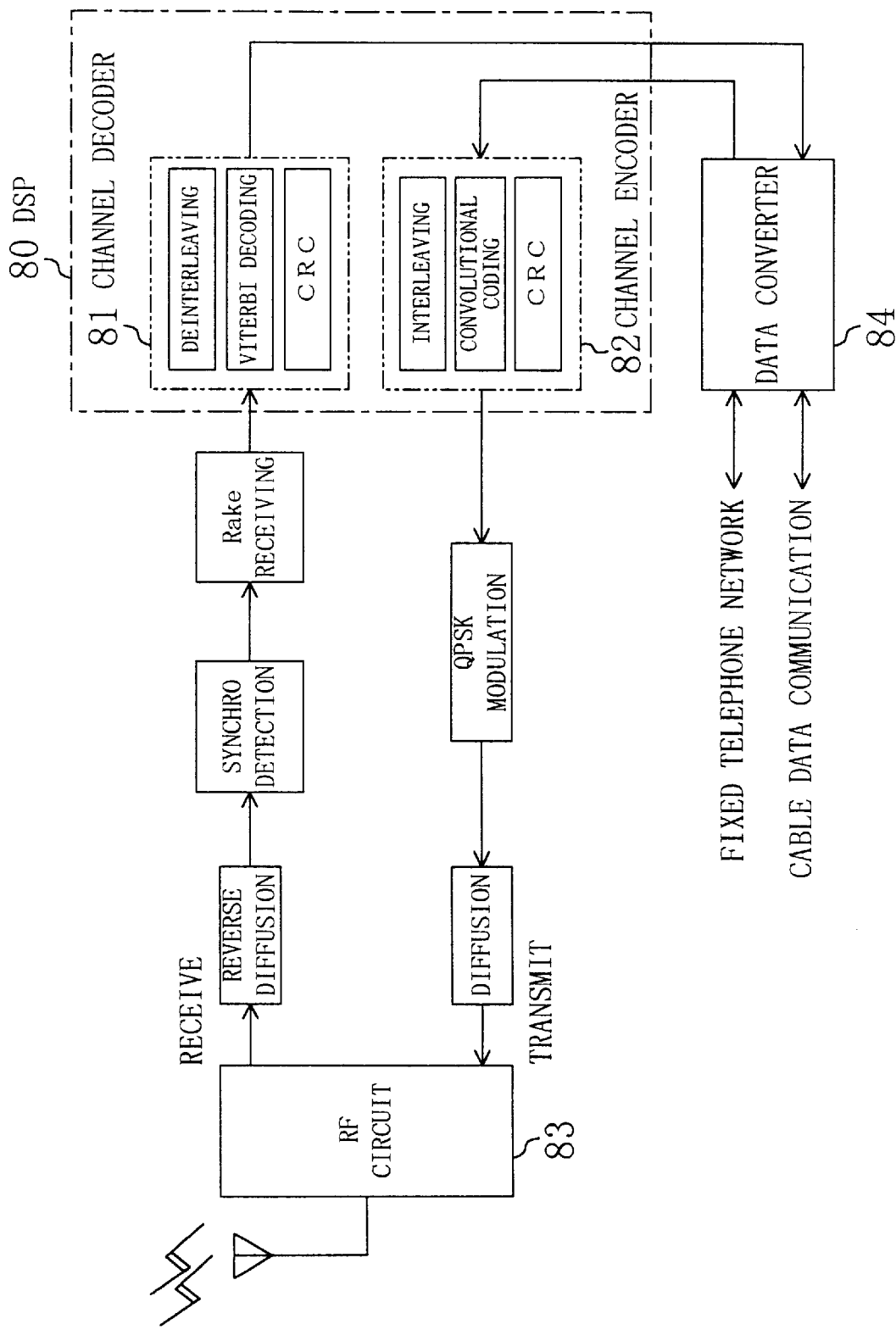
FIG. 10 is a block diagram for showing the configuration of a base station apparatus using the data processor of the invention.

The data processor of this invention can be used, for example, in a base station apparatus for communications. FIG. 10 is a block diagram for showing the configuration of a base station apparatus including the data processor of the invention, and this configuration is applicable to a CDMA system, that is, the next generation communication system. When the CDMA system is not adopted, diffusion and reverse diffusion are not necessary. In FIG. 10, a reference numeral 80 denotes a DSP, including a channel decoder 81 and a channel encoder 82, for mainly executing channel CODEC including decoding and encoding, and the DSP 10 executes an ACS processing by using the data processor of this invention.

A receiving operation is conducted by the base station apparatus of FIG. 10 as follows: First, a transmitting wave from portable equipment is received by an RF circuit 83 and is converted into a digital data through A/D conversion or the like. The digital data is converted into a received data through the reverse diffusion and synchronization detection. Since the received data is given an error in a communication channel, the channel decoder 81 executes a decoding processing including error correction, such as deinterleaving, Viterbi decoding and CRC (cyclic redundancy check), on the input received data. The thus decoded data is transmitted through a data converter 84 to a system having a different form from the radio communications, such as a fixed telephone network and cable data communication.

Furthermore, a transmitting operation is conducted as follows: The channel encoder 82 executes an encoding processing, such as interleaving, convolutional coding and CRC (cyclic redundancy check), on a data transferred from the data converter 84. The thus encoded data is subjected to modulation and the reverse diffusion, and is then transmitted to portable equipment by the RF circuit 83.

While portable equipment is provided with one DSP for the channel CODEC, the base station apparatus includes the DSP 80 of FIG. 10 in the number equal to that of the channels used by users. Accordingly, owing to the decrease in the power consumption brought by the present data processor, the power consumption of the entire base station apparatus can be remarkably decreased.

What is claimed is:

1. A data processor for updating path metrics in Viterbi decoding, comprising:

path metric storing means for storing pre-update path metrics in a manner that two pre-update path metrics necessary for obtaining one updated path metric are readable through one access; and an add compare select (ACS) processing unit for obtaining an updated path metric through an ACS processing on the basis of two pre-update path metrics read from said path metric storing means through one access.

2. The data processor of claim 1, wherein said path metric storing means includes a memory that stores said pre-update path metrics.

3. The data processor of claim 2, wherein said memory has a configuration that allows data respectively stored in an even address and an odd address having common bits excluding the least significant bits to be read through one access, and said path metric storing means stores, in said memory, two pre-update path metrics necessary for obtaining one updated path metric respectively in an even address and an odd address having common bits excluding the least significant bits.

4. The data processor of claim 3, wherein said path metric storing means stores said pre-update path metrics in said memory in an ascending order of bits indicating states respectively corresponding to said pre-update path metrics from one even address as a leading address.

5. The data processor of claim 1, wherein said ACS processing unit includes:

a first adder for adding one of two pre-update path metrics read from said path metric storing means to a branch metric;

a second adder for adding the other of said two pre-update path metrics to a branch metric;

a comparator for comparing a data resulting from addition by said first adder with a data resulting from addition by said second adder; and selecting means for selecting, as an updated path metric, one of said data resulting from the additions by said first adder and said second adder on the basis of comparison by said comparator.

6. The data processor of claim 1, further comprising another path metric storing means for storing updated path metrics obtained by said ACS processing unit in a manner that two updated path metrics necessary for obtaining one new updated path metric are readable through one access, wherein said ACS processing unit obtains a new updated path metric through the ACS processing on the basis of two updated path metrics read from said another path metric storing means through one access.

7. The data processor of claim 6,
wherein a new updated path metric obtained by said ACS processing unit is stored in said path metric storing means.

8. A data processor for updating path metrics in Viterbi decoding, comprising:
path metric storing means for storing pre-update path metrics; and
an add compare select (ACS) processing unit for obtaining a first updated path metric through an ACS processing on the basis of two pre-update path metrics read from said path metric storing means and for obtaining a second updated path metric through the ACS processing on the basis of said two pre-update path metrics.

9. The data processor of claim 8,
wherein, in the ACS processing for obtaining said first updated path metric, said ACS processing unit adds one of two pre-update path metrics read from said path metric storing means to a first branch metric and adds the other of said two pre-update path metrics to a second branch metric, and
in the ACS processing for obtaining said second updated path metric, said ACS processing unit adds said one of said two pre-update path metrics to said second branch metric and adds said other of said two pre-update path metrics to said first branch metric.

10. The data processor of claim 9,
wherein said ACS processing unit includes a first adder for adding said one of said pre-update path metrics to a branch metric and a second adder for adding said other of said pre-update path metrics to a branch metric, and
said data processor is further provided with branch metric storing means for storing branch metrics including said first and second branch metrics, said branch metric storing means supplying, in the ACS processing of said ACS processing unit for obtaining said first updated path metric, said first branch metric to said first adder and said second branch metric to said second adder, and supplying, in the ACS processing of said ACS processing unit for obtaining said second updated path metric, said first branch metric to said second adder and said second branch metric to said first adder.

11. A data processing method for updating path metrics in Viterbi decoding, comprising:
a path metric reading step of reading, through one access, two pre-update path metrics necessary for obtaining one updated path metric from path metric storing means for storing pre-update path metrics; and
an add compare select (ACS) processing step of executing an ACS processing for obtaining an updated path metric on the basis of two pre-update path metrics read in said path metric reading step.

12. The data processing method of claim 11,
wherein said path metric storing means includes a memory that stores said pre-update path metrics.

13. The data processing method of claim 12,
wherein said memory has a configuration that allows data respectively stored in an even address and an odd address having common bits excluding the least significant bits to be read through one access,
said path metric storing means stores, in said memory, two pre-update path metrics necessary for obtaining one updated path metric respectively in an even address and an odd address having common bits excluding the least significant bits, and
in said path metric reading step, two pre-update path metrics are read from said memory through one access by specifying an even address and an odd address having the common bits excluding the least significant bits where said two pre-update path metrics necessary for obtaining one updated path metric are stored.

14. The data processing method of claim 13,
wherein said path metric storing means stores said pre-update path metrics in said memory in an ascending order of bits indicating states respectively corresponding to said pre-update path metrics from one even address as a leading address.

15. The data processing method of claim 11,
wherein said ACS processing step includes:
a first adding procedure for adding one of two pre-update path metrics to a branch metric;
a second adding procedure for adding the other of said two pre-update path metric to a branch metric;
a comparing procedure for comparing a data resulting from said first adding procedure with a data resulting from said second adding procedure; and
a selecting procedure for selecting, as an updated path metric, one of said data resulting from said first adding procedure and said second adding procedure on the basis of a result of said comparing procedure.

16. A data processing method for updating path metrics in Viterbi decoding, comprising:
a path metric reading step of reading two pre-update path metrics necessary for obtaining one updated path metric from path metric storing means for storing pre-update path metrics;
a first add compare select (ACS) processing step of obtaining a first updated path metric through an ACS processing on the basis of two pre-update path metrics read in said path metric reading step; and
a second ACS processing step of obtaining a second updated path metric through the ACS processing on the basis of said two pre-update path metrics read in said path metric reading step.

17. The data processing method of claim 16,
wherein said first ACS processing step includes a step of adding one of said two pre-update path metrics to a first branch metric and the other of said two pre-update path metrics to a second branch metric, and
said second ACS processing step includes a step of adding said one of said two pre-update path metrics to said second branch metric and said other of said two pre-update path metrics to said first branch metric.

18. A base station apparatus for relaying radio communications, comprising:
a DSP for executing a decoding processing on a received data,
wherein said DSP includes a data processor which is used for executing Viterbi decoding for said decoding processing, said data processor comprising:
path metric storing means for storing pre-updated path metrics in a manner that two pre-update path metrics necessary for obtaining one updated path metric are readable through one access; and
an add compare select (ACS) processing unit for obtaining an updated path metric through an ACS processing on the basis of two pre-update path metrics read from said path metric storing means through one acccess.

19. A base station apparatus for relaying radio communications, comprising:
- a DSP for executing a decoding processing on a received data,
- wherein said DSP includes a data processor which is used for executing Viterbi decoding for said decoding processing, said data processor comprisng:
  - path metric storing means for storing pre-update path metrics; and
  - an add compare select (ACS) processing unit for obtaining a first updated path metric through an ACS processing on the basis of two pre-update path metrics read from said path metric storing means and for obtaining a second updated path metric through the ACS processing on the basis of said two pre-update path metrics.

* * * * *